(12) United States Patent
Kameda et al.

(10) Patent No.: US 8,742,378 B2
(45) Date of Patent: Jun. 3, 2014

(54) TARGET SUPPLY UNIT

(75) Inventors: Hidenobu Kameda, Oyama (JP);
Hakaru Mizoguchi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 112 days.

(21) Appl. No.: 13/401,389

(22) Filed: Feb. 21, 2012

(65) Prior Publication Data

US 2012/0236273 A1 Sep. 20, 2012

(30) Foreign Application Priority Data

Mar. 18, 2011 (JP) .................. 2011-060903

(51) Int. Cl.
*H05G 2/00* (2006.01)
(52) U.S. Cl.
USPC ....................................... 250/504 R (58) Field of Classification Search
CPC ........................................ H05G 2/006
USPC ..................................... 250/504 R
See application file for complete search history.

(56) References Cited

U.S. PATENT DOCUMENTS

| | | |
|---|---|---|
| 7,122,816 B2 | 10/2006 | Algots et al. |
| 8,497,489 B2 * | 7/2013 | Yabu et al. ............... 250/504 R |
| 2011/0101863 A1 * | 5/2011 | Komori et al. ........... 315/111.41 |

* cited by examiner

*Primary Examiner* — Michael Maskell
(74) *Attorney, Agent, or Firm* — McDermott Will & Emery LLP (57) ABSTRACT

A target supply unit may include: a reservoir for storing a target material; a heater provided inside the reservoir for heating the target material stored in the reservoir; a heater power supply for supplying current to the heater; and a target outlet for outputting the target material stored inside the reservoir.

10 Claims, 5 Drawing Sheets

TARGET SUPPLY UNIT

CROSS-REFERENCE TO RELATED APPLICATIONS

The present application claims priority from Japanese Patent Application No. 2011-060903 filed Mar. 18, 2011.

BACKGROUND

1. Technical Field

This disclosure relates to a target supply unit.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

A target supply unit according to one aspect of this disclosure may include: a reservoir for storing a target material; a heater provided inside the reservoir for heating the target material stored in the reservoir; a heater power supply for supplying a current to the heater; and a target outlet for outputting the target material stored inside the reservoir.

A target supply unit according to another aspect of this disclosure may include: a reservoir for storing a target material; an infrared heater provided outside the reservoir for heating the target material stored in the reservoir by radiated heat; a heater power supply for supplying a current to the infrared heater; and a target outlet for outputting the target material stored inside the reservoir.

A target supply unit according to yet another aspect of this disclosure may include: a reservoir for storing a target material; an induction heater provided outside the reservoir for heating the target material stored in the reservoir by induction heating; a high-frequency power supply for supplying a high-frequency current to the induction heater; and a target outlet for outputting the target material stored inside the reservoir.

BRIEF DESCRIPTION OF THE DRAWINGS

Embodiments of this disclosure will now be described with reference to the accompanying drawings.

DESCRIPTION OF PREFERRED EMBODIMENTS

Hereinafter, embodiments of this disclosure will be described in detail with reference to the accompanying drawings. The embodiments described below are merely illustrative in nature and do not limit the scope of this disclosure. Further, the configurations and operations described in connection with each embodiment are not necessarily essential in implementation of the configurations and operations in this disclosure. Like elements are referenced by like reference numerals or symbols, and duplicate descriptions thereof will be omitted herein.

TABLE OF CONTENTS

1. Overview
2. General Description of EUV Light Generation Apparatus
   2.1 Configuration
   2.2 Operation
3. Embodiments of Target Supply Unit
   3.1 First Embodiment
      3.1.1 Configuration
      3.1.2 Operation
   3.2 Second Embodiment
   3.3 Third Embodiment 1. Overview In each embodiment of this disclosure, to melt a metal for use as a target material in an EUV light generation apparatus and to retain the target material temperature at or above the melting point, the target material inside a reservoir may be directly heated. When the target material is directly heated, it may be possible to heat and melt the target material efficiently, as compared to a case where the reservoir is heated to heat the target material in the reservoir. It may also be possible to efficiently retain the target material temperature at or above the melting point.

2. General Description of EUV Light Generation Apparatus 2.1 Configuration

Figure 1:
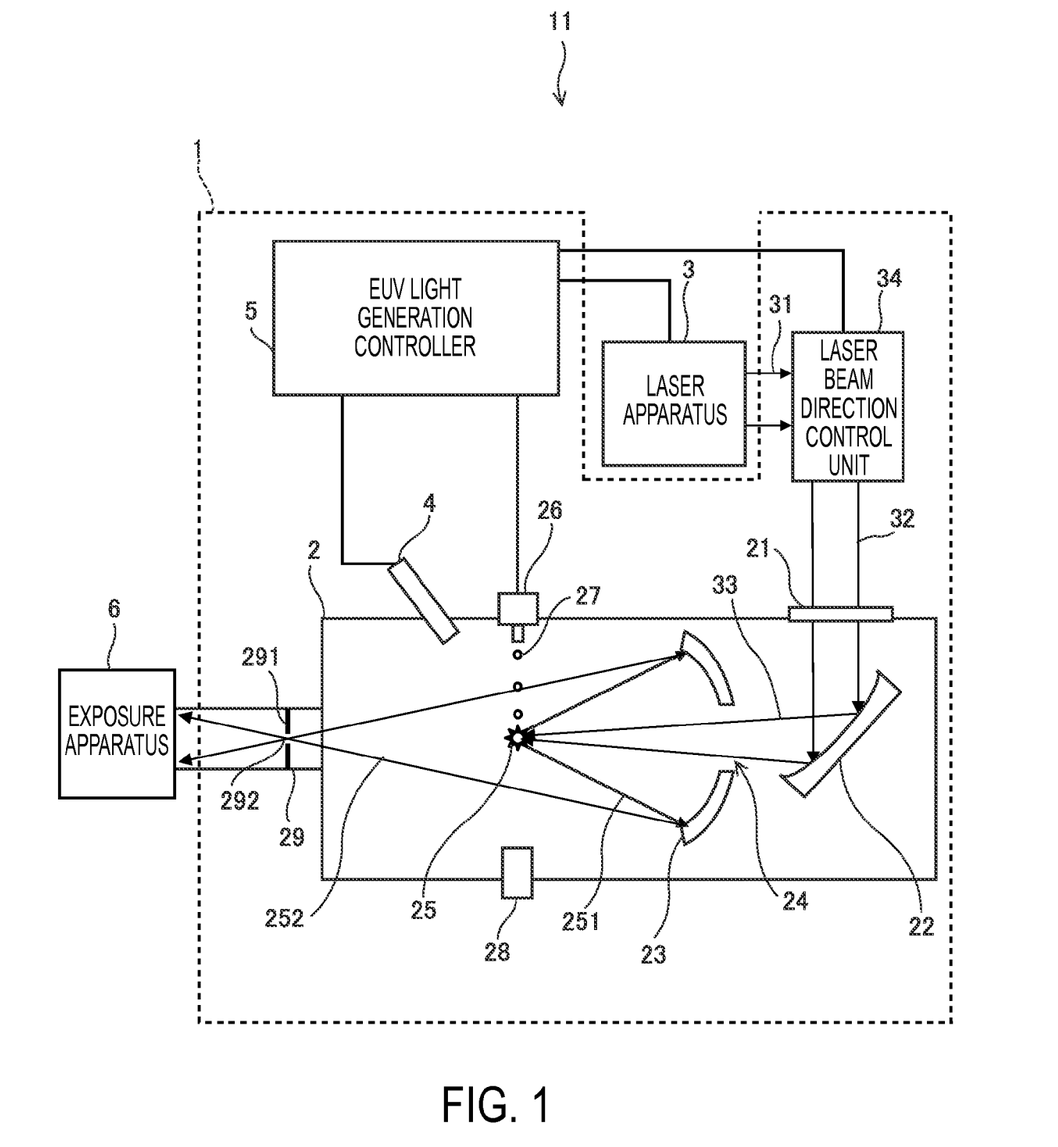
FIG. 1 schematically shows the configuration of an LPP-type EUV light generation apparatus.

FIG. 1 schematically illustrates the configuration of an exemplary LPP type EUV light generation system. An EUV light generation apparatus 1 may be used with at least one laser apparatus 3. In this application, a system including the EUV light generation apparatus 1 and the laser apparatus 3 may be referred to as an EUV light generation system 11. As illustrated in FIG. 1 and described in detail below, the EUV light generation apparatus 1 may include a chamber 2, a target supply unit (droplet generator 26, for example), and so forth. The chamber 2 may be airtightly sealed. The target supply unit may be mounted to the chamber 2 so as to pass through the wall of the chamber 2, for example. A target material to be supplied by the target supply unit may include, but is not limited to, tin, terbium, gadolinium, lithium, xenon, or any combination, alloy, or mixture thereof.

The chamber 2 may have at least one through-hole formed in the wall thereof. The through-hole may be covered with a window 21, and a pulsed laser beam 32 may travel through the window 21 into the chamber 2. An EUV collector mirror 23 having a spheroidal reflective surface may be disposed inside the chamber 2, for example. The EUV collector mirror 23 may have first and second foci. The EUV collector mirror 23 may have a multi-layered reflective film formed on a surface thereof, and the reflective film can include molybdenum and silicon that is laminated in alternate layers, for example. The EUV collector mirror 23 may preferably be disposed such that the first focus thereof lies in a plasma generation region 25 and the second focus thereof lies in an intermediate focus (IF) region 292 defined by the specification of an exposure apparatus 6. The EUV collector mirror 23 may have a through-hole 24 formed at the center thereof, and a pulsed laser beam 33 may travel through the through-hole 24.

The EUV light generation system 11 may include an EUV light generation controller 5. Further, the EUV light generation apparatus 1 may include a target sensor 4. The target sensor 4 may have an imaging function and may detect at least one of the presence, trajectory, and position of a target.

Further, the EUV light generation apparatus 1 may include a connection part 29 for allowing the interior of the chamber 2 and the interior of the exposure apparatus 6 to be in communication with each other. A wall 291 having an aperture may be disposed inside the connection part 29. The wall 291 may be disposed such that the second focus of the EUV collector mirror 23 lies in the aperture formed in the wall 291.

Further, the EUV light generation system 1 may include a laser beam direction control unit 34, a laser beam focusing mirror 22, and a target collection unit 28 for collecting a target 27. The laser beam direction control unit 34 may include an optical element for defining the direction in which the laser beam travels and an actuator for adjusting the position and the orientation (or posture) of the optical element.

2.2 Operation

With reference to FIG. 1, a pulsed laser beam 31 outputted from the laser apparatus 3 may pass through the laser beam direction control unit 34, and may be outputted from the laser beam direction control unit 34 as a pulsed laser beam 32 after having its direction optionally adjusted. The pulsed laser beam 32 may travel through the window 21 and enter the chamber 2. The pulsed laser beam 32 may travel inside the chamber 2 along at least one beam path from the laser apparatus 3, be reflected by the laser beam focusing mirror 22, and strike at least one target 27 as a pulsed laser beam 33.

The droplet generator 26 may output the targets 27 toward the plasma generation region 25 inside the chamber 2. The target 27 may be irradiated by at least one pulse of the pulsed laser beam 33. The target 27, which has been irradiated by the pulsed laser beam 33, may be turned into plasma, and rays of light including EUV light 251 may be emitted from the plasma. The EUV light 251 may be reflected selectively by the EUV collector mirror 23. EUV light 252 reflected by the EUV collector mirror 23 may travel through the intermediate focus region 292 and be outputted to the exposure apparatus 6. The target 27 may be irradiated by multiple pulses included in the pulsed laser beam 33.

The EUV light generation controller 5 may integrally control the EUV light generation system 11. The EUV light generation controller 5 may be configured to process image data of the droplet 27 captured by the target sensor 4. Further, the EUV light generation controller 5 may control at least one of the timing at which the target 27 is outputted and the direction into which the target 27 is outputted (e.g., the timing with which and/or direction in which the target is output from droplet generator 26). Furthermore, the EUV light generation controller 5 may control at least one of the timing with which the laser apparatus 3 oscillates (e.g., by controlling laser apparatus 3), the direction in which the pulsed laser beam 31 travels (e.g., by controlling laser beam direction control unit 34), and the position at which the pulsed laser beam 33 is focused (e.g., by controlling laser apparatus 3, laser beam direction control unit 34, or the like), for example. The various controls mentioned above are merely examples, and other controls may be added as necessary.

3. Embodiments of Target Supply Unit

3.1 First Embodiment

3.1.1 Configuration

Figure 2:
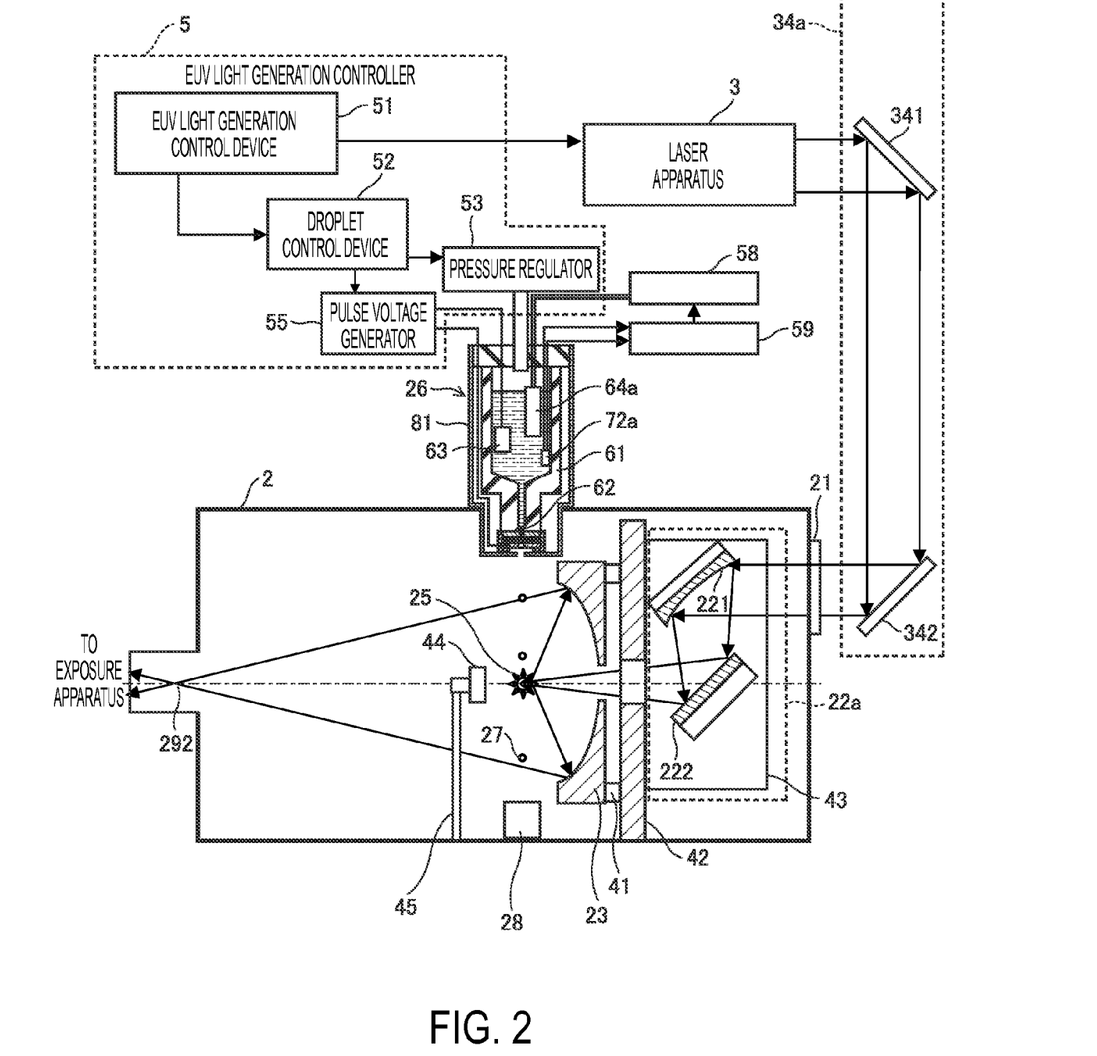
FIG. 2 is a partial sectional view of an EUV light generation apparatus in which a target supply unit according to a first embodiment is employed.

FIG. 2 is a partial sectional view of an EUV light generation apparatus in which a target supply unit according to a first embodiment is employed. As shown in FIG. 2, a laser beam focusing optical system 22a, the EUV collector mirror 23, the target collection unit 28, an EUV collector mirror holder 41, plates 42 and 43, a laser beam dump 44, and a laser beam dump support member 45 may be provided inside the chamber 2.

The plate 42 may be provided to the chamber 2, and the plate 43 may be provided to the plate 42. The EUV collector mirror 23 may be provided to the plate 42 via the EUV collector mirror holder 41.

The laser beam focusing optical system 22a may include an off-axis paraboloidal mirror 221, a plane mirror 222, and holders therefor. The off-axis paraboloidal mirror 221 and the plane mirror 222 may be provided to the plate 43 via their respective holders so that a pulse laser beam is focused in the plasma generation region 25. The laser beam dump 44 may be provided to the chamber 2 via the laser beam dump support member 45 and may be disposed in the beam path of a pulse laser beam. The target collection unit 28 may be disposed in the trajectory of the target 27 and at a position lower than the plasma generation region 25 in the droplet traveling direction (toward the bottom of the figure).

The chamber 2 may be provided with the window 21 and the droplet generator (target supply unit) 26. A detailed description of the droplet generator 26 will be given later. A heated and molten metal or the like may be used as a target material. In the following embodiments, tin (Sn), which has a melting point of 232° C., is used as an example.

A beam delivery unit 34a and the EUV light generation controller 5 may be provided outside the chamber 2. The beam delivery unit 34a may include high-reflection mirrors 341 and 342, holders therefor, and a housing. The EUV light generation controller 5 may include an EUV light generation control device 51, a droplet control device 52, a pressure regulator 53, and a pulse voltage generator 55.

Figure 3:
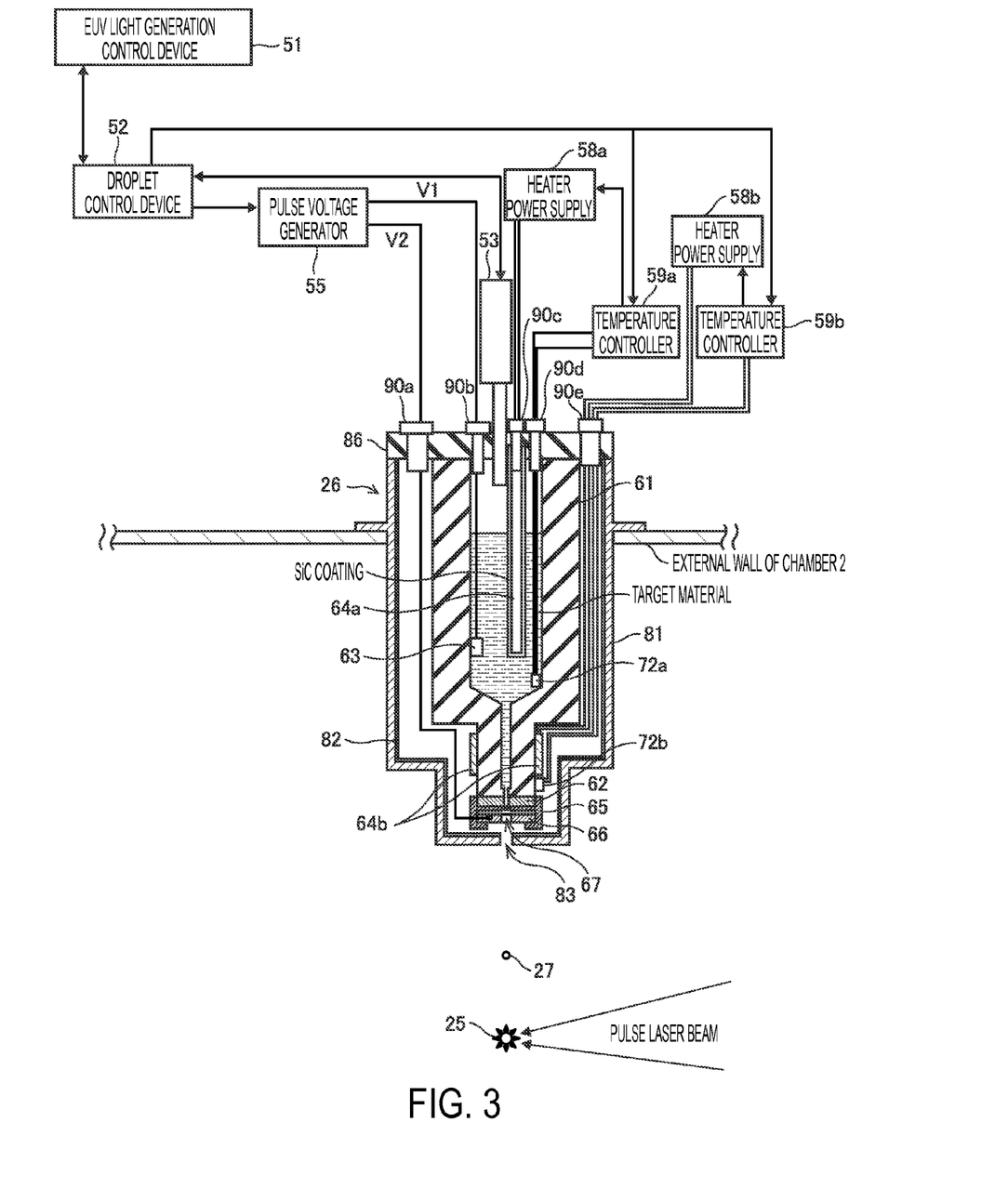
FIG. 3 is a partial sectional view of the target supply unit according to the first embodiment.

Next, the configuration of the droplet generator 26 will be described in more detail. FIG. 3 is a partial sectional view of the target supply unit according to the first embodiment. As shown in FIG. 3, the droplet generator 26 may include a reservoir 61, a nozzle 62, an electrode 63, a heater 64a, an electrical insulating member 65, and a pull-out electrode 66. The reservoir 61 and the nozzle 62 may be formed integrally or separately. The droplet generator 26 may be configured to generate the target 27 on demand. The target supply unit is not limited to the droplet generator 26 which supplies the target material in the form of droplet. The target supply unit may be configured to output a continuous jet of the liquid target material.

The reservoir 61 may be formed of an electrically non-conductive material, such as synthetic quartz ($SiO_2$) or alumina ($Al_2O_3$). Alternatively, the reservoir 61 may be formed of an electrically conductive material, such as molybdenum (Mo), or of a semiconductor material, such as silicon carbide (SiC). Similarly, the nozzle 62 may be formed of an electrically non-conductive material, such as synthetic quartz or alumina, an electrically conductive material, such as molybdenum, or a semiconductor material, such as silicon carbide. The reservoir 61 may store the target material, such as tin, as mentioned above.

The heater 64a, together with the target material, may be contained in the reservoir 61. The heater 64a may include a resistive element that generates Joule heat by a current. The target material may be heated by the heater 64a to thereby be molten, and the molten state of the target material may then be retained in the reservoir 61. The droplet generator 26 may further include a temperature sensor 72a for detecting the temperature of the target material in the reservoir 61. The heater 64a and temperature sensor 72a may be coated with a material having low reactivity with the target material. Such a material may be silicon carbide, for example.

A flexible heater 64b and a temperature sensor 72b may further be provided in the vicinity of the nozzle 62 of the droplet generator 26. The flexible heater 64b and the temperature sensor 72b may be provided outside the reservoir 61. The flexible heater 64b may preferably be capable of fitting the shape of the reservoir in the vicinity of the nozzle 62. In place of the flexible heater 64b, many small heaters may be disposed so as to fit the shape of the reservoir 61 in the vicinity of the nozzle 62. Alternatively, the reservoir 61 in the vicinity of the nozzle 62 may be given a shape which fit, for example, an off-the-shelf heater.

The nozzle 62 has a through-hole (orifice) formed therein for outputting the target 27. The target 27 may be output toward the plasma generation region 25 in the chamber 2 through the nozzle 62 (see also FIG. 2).

The electrical insulating member 65 that holds the pull-out electrode 66 may be attached to the nozzle 62. The electrical insulating member 65 provides electrical insulation between the nozzle 62 and the pull-out electrode 66. The pull-out electrode 66 may be disposed so as to face an outlet-side surface of the nozzle 62 in order to allow the electrostatic force to act on the liquid target material through the orifice formed in the nozzle 62. The pull-out electrode 66 has a through-hole 67 formed, for example, at the center thereof to allow the target 27 to pass therethrough.

The pressure regulator 53 may regulate the pressure of an inert gas supplied from an inert gas cylinder (not shown) as necessary, to push the liquid target material to the leading end of the nozzle 62. The droplet control device 52 may control the pressure regulator 53 and the pulse voltage generator 55 so that the target 27 is generated when receiving an instruction from the EUV light generation control device 51.

A wire connected to one output terminal of the pulse voltage generator 55 is connected to the electrode 63 that is in contact with the liquid target material. A wire connected to the other output terminal of the pulse voltage generator 55 is connected to the pull-out electrode 66. Under the control of the droplet control device 52, the pulse voltage generator 55 generates a pulse signal for pulling out the liquid target material.

For example, the pulse voltage generator 55 may generate a pulse signal that varies from a reference potential V2 (0 V, for example) to a predetermined potential V1 that is different from the reference potential. The pulse voltage generator 55 may apply this pulse signal to the liquid target material via the electrode 63. The pulse voltage generator 55 may also apply the potential V2 to the pull-out electrode 66.

A pulse voltage (V1-V2) is thereby applied between the liquid target material and the pull-out electrode 66. Alternatively, when the nozzle 62 is made of metal, the pulse voltage generator 55 may apply the pulse voltage (V1-V2) between the nozzle 62 and the pull-out electrode 66. In this case, the wire connected to one output terminal of the pulse voltage generator 55 may be connected to the nozzle 62, instead of to the electrode 63.

The reservoir 61, the nozzle 62, the electrical insulating member 65, and the pull-out electrode 66 of the droplet generator 26 may be enclosed in a shielding container that includes a cover 81 and a lid 86 attached to the cover 81. The cover 81 has a through-hole 83 formed therein to allow the target 27 output through the nozzle 62 to pass therethrough. The cover 81 prevents a charged particle emitted from the plasma generated in the plasma generation region 25 from reaching an electrical insulator such as the electrical insulating member 65.

The cover 81 includes an electrically conductive material (e.g., metal material), thereby having conductivity, and is electrically connected through a connecting member such as a wire, or directly, to an electrically conductive structural member (e.g., external wall) of the chamber 2. The electrically conductive structural member of the chamber 2 is electrically connected to the reference potential (0 V) of the pulse voltage generator 55, and may further be grounded. The reservoir 61 is attached to the cover 81 via the lid 86. An electrically non-conductive material such as mullite may be used as a material of the lid 86.

A wire from the pull-out electrode 66 may be connected to the pulse voltage generator 55 via a relay terminal 90a provided in the lid 86. A wire from the electrode 63, which applies a pulse signal to the liquid target material, may be connected to the pulse voltage generator 55 via a relay terminal 90b provided in the lid 86. A wire from the heater 64a may be connected to a heater power supply 58a via a relay terminal 90c provided in the lid 86. A wire from the temperature sensor 72a may be connected to a temperature controller 59a via a relay terminal 90d provided in the lid 86. Wires from the flexible heater 64b and temperature sensor 72b may be connected to a heater power supply 58b and a temperature controller 59b, respectively, via a relay terminal 90e provided in the lid 86.

A reflector 82 for reflecting heat radiated from the reservoir 61 is formed on the inner surface of the cover 81. The reflector 82 may be a coating of a material having high infrared ray reflectivity. A space between the cover 81 and the reservoir 61 communicates with the chamber 2 via the through-hole 83, and is retained in a low-pressure state as in the interior of the chamber 2.

3.1.2 Operation

Current from the heater power supplies 58a and 58b passes through the heater 64a and the flexible heater 64b, respectively, by which Joule heat is generated. The Joule heat is thermally conducted to the target material, which is thereby heated. The temperature controllers 59a and 59b receive detection signals output respectively from the temperature sensors 72a and 72b, and respectively control the values of currents to be supplied from the heater power supplies 58a and 58b to the heater 64a and the flexible heater 64b. The temperature of the target material in the reservoir 61 is controlled to be at or above the melting point of the target material.

According to the first embodiment, the heater 64a is disposed inside the reservoir 61, and therefore the target material is directly heated by the heater 64a. It may thus be possible to heat the target material efficiently, as compared to a case where the target material is indirectly heated through the reservoir 61 (the reservoir 61 is heated to heat the target material therein).

Because the inner surface of the cover 81 is coated with the reflector 82 having high infrared ray reflectivity, the heat energy of the target material heated inside the reservoir 61 is prevented from being emitted outside the cover 81 by thermal radiation. The space between the cover 81 and the reservoir 61 is retained in a low-pressure state as in the interior of the chamber 2. Accordingly, the heat energy of the target material in the reservoir 61 is also prevented from being emitted outside the cover 81 by thermal conduction through a gas in the space between the cover 81 and the reservoir 61. According to the first embodiment, it may thus be possible to heat the target material efficiently, and retain the target material in the molten state.

Referring again to FIG. 2, the EUV light generation control device 51 may output a droplet output signal to the droplet control device 52, and output a pulse laser beam output signal to the laser apparatus 3. The droplet control device 52 outputs a droplet generation signal to the pulse voltage generator 55 according to the droplet output signal. The pulse voltage generator 55 applies a pulsing voltage to the target material in the reservoir 61 according to the droplet generation signal. The electrostatic force is thereby generated between the target material in the reservoir 61 and the pull-out electrode 66, the target material is pulled out through the leading end of the nozzle 62, and a charged target 27 is generated. The target 27 is charged by the potential difference (V1-V2) applied between the electrode 63 and the pull-out electrode 66. The target 27 is output from the droplet generator 26 toward the plasma generation region 25.

The laser apparatus 3 outputs a pulse laser beam according to the pulse laser beam output signal. The pulse laser beam output from the laser apparatus 3 may be reflected off the high-reflection mirrors 341 and 342 of the beam delivery unit 34a, and may enter the laser beam focusing optical system 22a. The pulse laser beam having entered the laser beam focusing optical system 22a may be reflected off the off-axis paraboloidal mirror 221 and the plane mirror 222, and may be focused onto the target 27 as the target 27 reaches the plasma generation region 25.

In this way, the target 27 is irradiated by a pulse laser beam when the target 27 reaches the plasma generation region 25. The target material is thereby turned into plasma, from which EUV light is emitted. The emitted EUV light may be focused in the IF region 292 by the EUV collector mirror 23, and may enter the exposure apparatus.

3.2 Second Embodiment

Figure 4:
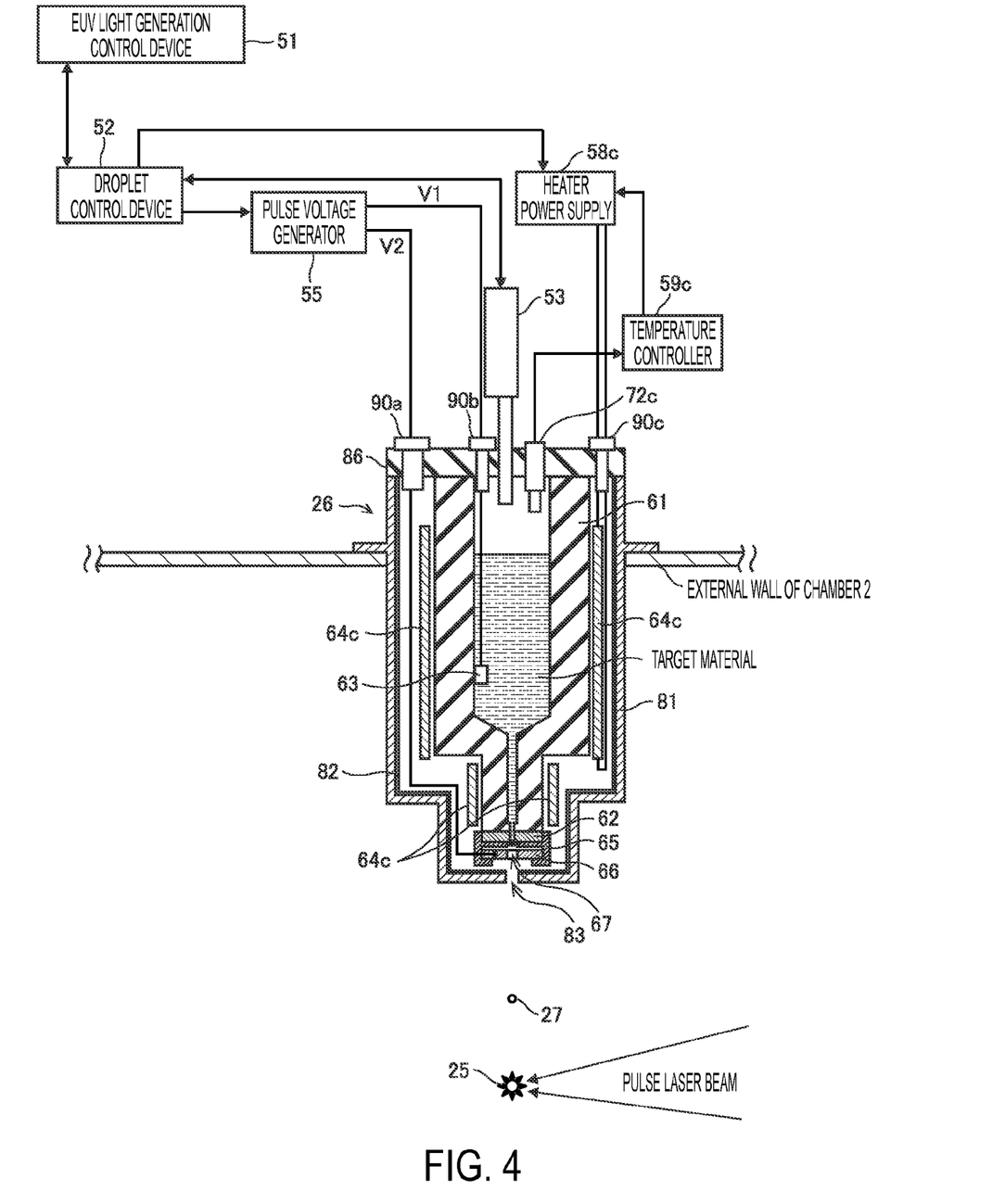
FIG. 4 is a partial sectional view of a target supply unit according to a second embodiment.

FIG. 4 is a partial sectional view of a target supply unit according to a second embodiment. The second embodiment is different from the first embodiment in that an infrared heater 64c is disposed in a space between the reservoir 61 and cover 81, instead of a heater being contained in the reservoir 61.

The infrared heater 64c may comprise a halogen lamp, for example. A wire from the infrared heater 64c may be connected to a heater power supply 58c via the relay terminal 90c provided in the lid 86.

A radiation thermometer 72c may be provided to the lid 86. A high-temperature target material radiates infrared rays or visible rays having the wavelength and intensity according to the material and temperature of the target. The radiation thermometer 72c detects the infrared rays or the visible rays generated from the target material in the reservoir 61, and outputs a detection signal according to the wavelength and the intensity of the rays. The radiation thermometer 72c may be a fiber thermometer that includes an optical fiber with an opening toward an object of which the temperature is to be measured. A wire from the radiation thermometer 72c may be connected to a temperature controller 59c.

The infrared heater 64c is supplied with power from the heater power supply 58c, and then generates infrared rays. The temperature controller 59c receives the detection signal output from the radiation thermometer 72c, and controls current to be supplied from the heater power supply 58c to the infrared heater 64c. The reservoir 61 may preferably be formed of a material having high transmissivity for infrared rays and low reactivity with the target material. Such a material for reservoir 61 may be quartz glass ($SiO_2$), for example.

According to the second embodiment, the infrared heater 64c is disposed in the space between the reservoir 61 and the cover 81. It may thus be possible to heat the target material in the reservoir 61 directly by the infrared rays transmitted through the reservoir 61. Because the infrared heater 64c is not in direct contact with the target material in the reservoir 61, it may not be necessary to coat the infrared heater 64c with a material having low reactivity with the target material.

The inner surface of the cover 81 is coated with the reflector 82 having high infrared ray reflectivity, and therefore, not only the infrared rays radiated from the target material in the reservoir 61, but also the infrared rays radiated from the infrared heater 64c, may be reflected. It may thus be possible to heat the target material efficiently, and retain the target material in the molten state.

In the second embodiment, the radiation thermometer 72c may detect the temperature of the target material without having to be in contact with the target material. Accordingly, it may not be necessary to coat the radiation thermometer 72c with a material having low reactivity with the target material.

3.3 Third Embodiment

Figure 5:
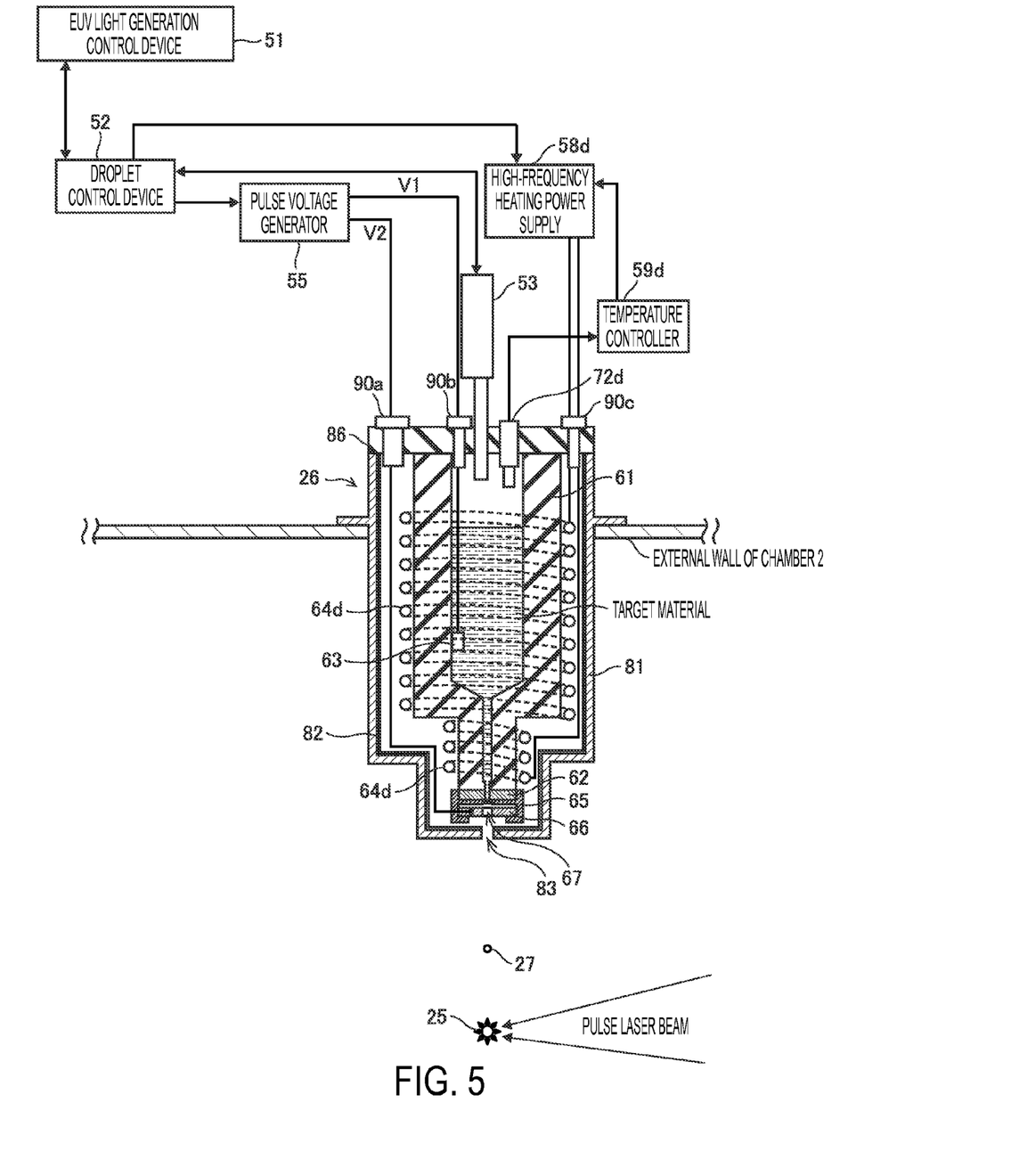
FIG. 5 is a partial sectional view of a target supply unit according to a third embodiment.

FIG. 5 is a partial sectional view of a target supply unit according to a third embodiment. The third embodiment is different from the first embodiment in that a coil 64d constituting an induction heater is disposed in a space between the reservoir 61 and the cover 81, instead of a heater being contained in the reservoir 61.

The coil 64d may comprise a conductor wound around the reservoir 61. Wires connected to both ends of the coil 64d may be connected to a high-frequency heating power supply 58d via the relay terminal 90c provided in the lid 86. The coil 64d is supplied with a high-frequency current from the high-frequency heating power supply 58d. Around the coil 64d, the high-frequency current generates a magnetic field that changes periodically. The magnetic field generates an eddy current in a metal constituting the target material, and the eddy current generates Joule heat in the target material.

A radiation thermometer 72d may be fixed to the lid 86. The radiation thermometer 72d detects the infrared rays or the visible rays generated from the target material in the reservoir 61, and outputs a detection signal according to the wavelength and the intensity of the rays. The radiation thermometer 72d may be a fiber thermometer that includes an optical fiber with an opening toward an object of which the temperature is to be measured. A wire from the radiation thermometer 72d may be connected to a temperature controller 59d. The temperature controller 59d receives the detection signal output from the radiation thermometer 72d, and controls the current value of a high-frequency current to be supplied from the high-frequency heating power supply 58d to the coil 64d.

According to the third embodiment, the coil 64*d* of the induction heater is disposed in the space between the reservoir 61 and the cover 81. It may thus be possible to heat the target material in the reservoir 61 directly by induction heating. Because the coil 64*d* is not in direct contact with the target material in the reservoir 61, it may not be necessary to coat the coil 64*d* with a material having low reactivity with the target material.

In the third embodiment, the radiation thermometer 72*d* may detect the temperature of the target material without having to be in contact with the target material. Accordingly, it may not be necessary to coat the radiation thermometer 72*d* with a material having low reactivity with the target material.

The above-described embodiments and the modifications thereof are merely examples for implementing this disclosure, and this disclosure is not limited thereto. Making various modifications according to the specifications or the like is within the scope of this disclosure, and other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as at least one or "one or more."

What is claimed is:

1. A target supply unit comprising:
    a reservoir for storing a target material;
    a heater provided inside the reservoir for heating the target material stored in the reservoir;
    a heater power supply for supplying current to the heater; and
    a target outlet for outputting the target material stored inside the reservoir.

2. The target supply unit according to claim 1, wherein the heater includes a resistive element that generates Joule heat by the current.

3. The target supply unit according to claim 1, further comprising:
    a shielding member for shielding an area surrounding the reservoir from the outside, the shielding member having a through-hole through which a droplet output from the target outlet passes.

4. The target supply unit according to claim 3, further comprising a reflector formed on an inner surface of the shielding member, the reflector having higher infrared ray reflectivity than that of the reservoir.

5. The target supply unit according to claim 3, wherein a pressure in the area surrounded by the shielding member is lower than an atmospheric pressure.

6. The target supply unit according to claim 3, wherein the area surrounded by the shielding member is in communication through the through-hole with a chamber in which a pressure is lower than an atmospheric pressure.

7. A target supply unit, comprising:
    a reservoir for storing a target material;
    an infrared heater provided outside the reservoir for heating the target material stored in the reservoir by radiated heat, the infrared heater having a surface facing the reservoir with a clearance;
    a heater power supply for supplying current to the infrared heater; and
    a target outlet for outputting the target material stored inside the reservoir.

8. The target supply unit according to claim 7, wherein the reservoir has higher infrared ray transmissivity than that of the target material.

9. A target supply unit comprising
    a reservoir for storing a target material;
    an induction heater provided outside the reservoir for heating the target material stored in the reservoir by induction heating;
    a high-frequency power supply for supplying high-frequency current to the induction heater; and
    a target outlet for outputting the target material stored inside the reservoir.

10. The target supply unit according to claim 9, wherein the induction heater includes a coil wound around the reservoir.

* * * * *